United States Patent [19]
Williams et al.

[11] Patent Number: 6,030,208
[45] Date of Patent: Feb. 29, 2000

[54] THERMAL PROCESSOR

[75] Inventors: Victor J. Williams; Robert A. Weaver, both of Whitefish; Coby S. Grove, Columbia Falls, all of Mont.

[73] Assignee: Semitool, Inc., Kalispell, Mont.

[21] Appl. No.: 09/094,354

[22] Filed: Jun. 9, 1998

[51] Int. Cl.⁷ .................................................. F27D 5/00
[52] U.S. Cl. ..................... 432/253; 414/153; 414/172; 901/16
[58] Field of Search ..................... 432/241, 5, 6, 432/11, 253; 414/152, 153, 172, 192; 901/16, 17

[56] References Cited

U.S. PATENT DOCUMENTS

| | | | |
|---|---|---|---|
| 4,132,318 | 1/1979 | Wang et al. .............................. | 901/16 |
| 4,722,659 | 2/1988 | Hoyt, III et al. . | |
| 4,886,412 | 12/1989 | Wooding et al. . | |
| 5,064,337 | 11/1991 | Asakawa et al. . | |
| 5,100,286 | 3/1992 | Anderson ................................. | 901/16 |
| 5,178,639 | 1/1993 | Nishi ...................................... | 414/152 |
| 5,217,340 | 6/1993 | Harada et al. .......................... | 414/172 |
| 5,243,872 | 9/1993 | Yang et al. .............................. | 901/16 |
| 5,378,145 | 1/1995 | Ono et al. . | |
| 5,462,397 | 10/1995 | Iwabuchi . | |
| 5,464,313 | 11/1995 | Ohsawa .................................. | 414/172 |
| 5,562,383 | 10/1996 | Iwai et al. . | |
| 5,581,644 | 12/1996 | Saito et al. ............................. | 901/16 |
| 5,586,880 | 12/1996 | Ohsawa .................................. | 432/241 |
| 5,697,749 | 12/1997 | Iwabuchi et al. . | |
| 5,885,045 | 3/1999 | Rush ...................................... | 414/417 |

FOREIGN PATENT DOCUMENTS

| | | |
|---|---|---|
| 0 560 439 A1 | 9/1993 | European Pat. Off. . |
| 43 26 309 C1 | 9/1994 | Germany . |
| 401253232 | 10/1989 | Japan . |

*Primary Examiner*—John A. Jeffery
*Assistant Examiner*—Jiping Lu
*Attorney, Agent, or Firm*—Lyon & Lyon LLP

[57] ABSTRACT

A thermal processor for treating a plurality of semiconductor articles introduced into the processor and pods includes a work-in-process stocker and furnace combination. The stocker includes a loading port, shelves for storing pods and a loadport. The loadport includes a pod opener and is positioned at a port through to the furnace housing. The pod opener may be an indexer for an SMIF pod or a FOUP loadport for handling a 300 mm. wafer pod. A manipulator within the stocker operates to receive and output pods from the processor, present pods to the loadport for loading and unloading and warehousing pods between such operations. In one embodiment, the manipulator operates in an X-axis, Y-axis horizontal plane as well as in a Z-axis direction and rotation about the Z-axis. In the other, the Y-axis degree of freedom is eliminated. The cooperating furnace includes a preload wafer station and a cooling wafer station in combination with a double lift furnace having a process container and a furnace heating element assembly which can be lowered independently for processing. An end effector within the furnace housing cooperates with the stocker as well as with the furnace for most efficient operation.

21 Claims, 12 Drawing Sheets

THERMAL PROCESSOR

BACKGROUND OF THE INVENTION

The field of the present invention is thermal processors and stocking systems for semiconductor articles for such processors.

In the processing of semiconductor articles such as wafers, it is often desirable to place the wafers in a furnace for high temperature treatment. Such furnaces typically include a mechanism whereby wafers are stacked in a spaced array in order that the surfaces of each wafer are exposed to the reactive gases within the furnace.

One such furnace includes a base of circular construction upon which a pedestal is placed. An article support extends upwardly from the pedestal to receive a column of horizontally disposed and vertically displaced wafers. The wafers are supported only on the outer edges. A process container which is typically a quartz cylinder and dome may be lowered about the column into a sealing arrangement with the base. A furnace heating element assembly is then lowered about the process container until it too rests on the base. The process container and the furnace heating element assembly may be raised and lowered by independent lifts which can be, for example, pneumatic cylinders.

With such furnaces, a furnace housing is provided which encloses the entire furnace mechanism and provides a very clean environment. Within the furnace housing, in addition to the furnace, two further article supports may be provided to receive wafers in the same orientation as the furnace itself, defining a preload station and a cooling station. The first column of wafers is typically to accommodate a full furnace charge of unprocessed wafers while the second column of wafers receives the same quantity of already processed wafers. A robot having a semiconductor wafer end effector is included within the furnace housing. The robot with the end effector is able to extend to an indexer port where pods of wafers are presented. The end effector moves individual wafers from such a pod to the first column of wafers within the furnace housing. The same end effector is also able to extend to the article support within the furnace to both load and unload individual wafers therefrom. Further, it can extend to the second of the article supports in the furnace housing in order that the furnace may be unloaded, the wafers cooled and ultimately the wafers replaced into a pod at the loadport.

In operation, a pod of approximately twenty-five wafers is positioned at the loadport. These wafers are moved one at a time by the end effector and placed in the preload wafer column. Completed wafers may be unloaded from the cooling wafer column by placing them back in a waiting pod at the indexer port. The process of both loading the furnace housing from the pods and loading the pods from the furnace housing may be accomplished during a furnace cycle when the process container and furnace heating element assembly have been brought down onto the base and heated according to a preset thermal cycle.

The pods are of known construction. In the case of 200 mm. wafers, the pods tend to be defined by a base with a cover. The cover is locked to the base and extends outwardly around the base as well. Indexers are available for pods accommodating 200 mm. wafers which automatically unlock the base from the cover and lower the base from beneath the cover for access to the wafers. In a 300 mm. pod, a door is provided on one side of the pod. The door may be unlocked and removed for access to the wafers within. As the pods typically do not include a full charge for the furnace, multiple pods must be positioned for the wafer end effector to unload to the preload station or load from the cooling station. The pods are then resealed and locked for transportation to storage or a further process.

The loading or unloading of one pod may take approximately ten minutes to accomplish. Time is available during the heating cycle when preparatory tasks might be conducted. To create a most efficient use of the furnace time for both loading and unloading between heating cycles, the columns within the furnace housing for incoming and outgoing wafers can be appropriately charged from and discharged to the pods during the thermal furnace cycle. This maximizes the efficiency of the loading and unloading process. Even so, it is disadvantageous to require manual loading of the furnace where attention must be directed to the furnace approximately every ten minutes. Consequently, the possibility has been known to provide a work-in-progress stocker for storing wafers in pods on a more rapid basis in a clean environment for later automatic delivery to the loadport of the furnace housing.

SUMMARY OF THE INVENTION

The present invention is directed to a thermal processor for treating a plurality of semiconductor articles presented in pods. Such articles are most appropriately semiconductor wafers contained within conventional wafer pods. A pod stocker housing is contemplated with a stocker loadport, a furnace loadport, shelves in the stocker housing and a manipulator to process pods presented at the stocker loadport into storage within the stocker, to the furnace loadport for loading and unloading and ultimately back to the stocker loadport with treated wafers. The manipulation of the pods into and from storage on an automated basis provides for a charging of the system at approximately one pod of twenty-five wafers per minute. In this way, efficient use of employee and furnace capabilities is achieved.

In a first separate aspect of the present invention, a manipulator including a lifter is associated with the stocker of the thermal processor for engaging and manipulating each pod. Shelves are provided for receiving pods and cooperating with the lifter. Access to the furnace through a pod mechanism with the lifter is also possible.

In a second, separate aspect of the present invention, the stocker manipulator of the thermal processor operates such that the lifter is movable horizontally in two-dimensional space as well as vertically and pivotally. With such motions, two vertical columns of shelving may be employed for the pods along with a stocker loadport accessible by the lifter. Guides and mounting brackets may be employed to provide the degrees of movement contemplated for the manipulator.

In a third, separate aspect of the present invention, a thermal processor for treating a plurality of semiconductor articles presented in pods includes a stocker with a stocker housing having a furnace loadport, a stocker loadport shelves within the stocker housing accessed by a manipulator having a lifter that moves horizontally only in a linear direction as well as vertically and pivotally. By having the lifter move horizontally only in a linear direction, motion, alignment, operational and mechanical complexity and the number of motion steps may be minimized.

In a fourth, separate aspect of the present invention, the thermal processor of the third separate aspect is contemplated to further include a support movable through the stocker loadport such that pods may be easily manipulated into the stocker housing from a first position outwardly of the stocker loadport. This arrangement provides for further simplification of the manipulator motion and apparatus.

In a fifth, separate aspect of the present invention, any of the foregoing thermal processors are specifically contemplated for association with a double-lift furnace having a robotically controlled end effector which can cooperate through the furnace housing port with the pod manipulator to input and output such articles to and from the furnace.

In a sixth, separate aspect of the present invention, the combination of any of the foregoing separate aspects is contemplated.

Accordingly, it is an object of the present invention to provide an improved work-in-process stocker and thermal processor. Other and further objects and advantages will appear hereinafter.

DETAILED DESCRIPTION OF THE PREFERRED EMBODIMENTS

Figure 1:
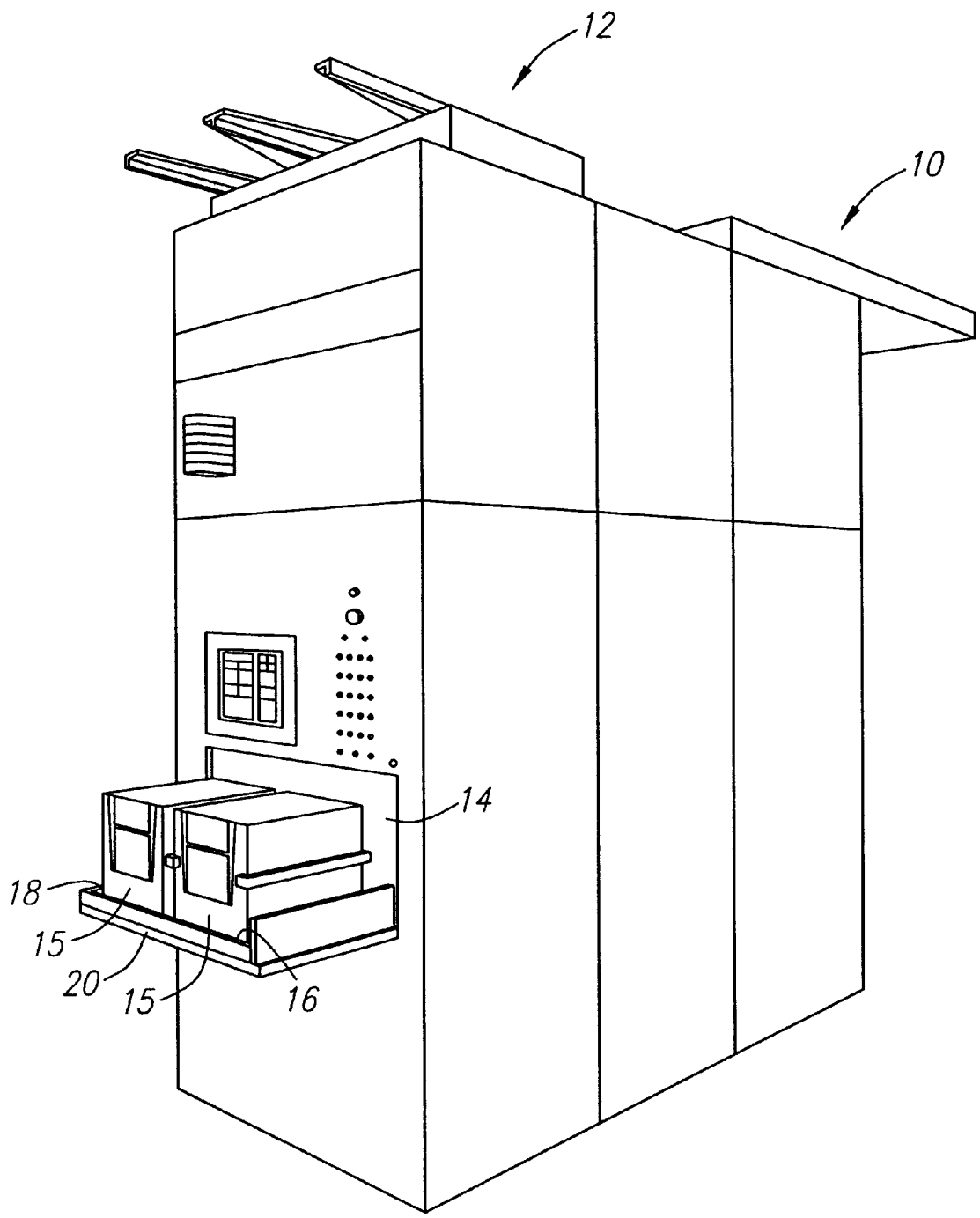
FIG. 1 is a front perspective of a thermal processor for treating semiconductor articles presented to the processor and pods.

Turning in detail to the Figures, a thermal processor is illustrated which includes a furnace, generally designated 10, and a pod stocker for work in progress, generally designated 12. In normal operation, the thermal processor is accessed through the stocker loadport 14 in the front of the stocker 12 where pods with wafers therein are placed.

Commercially available pods 15 of the standard mechanical interface type (SMIF), each having a base and a cover, may be positioned at one or the other of two pod receiving stations 16 and 18 located on a loading shelf 20 at the stocker loadport 14. The pod receiving stations 16 and 18 receive closed and locked pods. One such pod is illustrated in U.S. Pat. No. 4,815,912, the disclosure of which is incorporated herein by reference. Such pods 15 include a base and a cover locked thereto. The pod 15 typically accommodates twenty-five semiconductor wafers held in a column with the wafers in a horizontal orientation and a vertically spaced relationship held on the outer edges thereof. Such pods 15 typically are locked and unlocked from the bottom and the cover has a larger dimension than the base. Consequently, the pod 15 is able to be received in its closed condition where it protects the enclosed wafers from contamination. Employing an indexer, the pod 15 may be unlocked and, while the cover is supported about a frame, the base may be lowered by an elevator to expose the wafers. Reference is again made to U.S. Pat. No. 4,815,912 and to U.S. Pat. No. 4,995,430, the disclosure of which is incorporated herein by reference.

The stocker 12 receives and manipulates the pods 15 in their locked condition. This allows approximately twenty-five wafers to be received and stocked at a time, relieving the loading personnel from waiting for each wafer to be unloaded.

The stocker 12 includes a housing frame 22, which supports panels 24 to create an enclosure. A frame 26 receives a filter in the top of the stocker 12 which cooperate with grates 28 in the floor to promote laminar flow clean air downwardly through the housing. Interior mounting panels 30 are positioned on the interior sides of the housing frame 22. Shelves 32 are arranged on the interior mounting panels 30 to one side of the stocker interior. There are nine such shelves 32, with each shelf capable of mounting two pods. Thus, this embodiment is able to hold eighteen pods.

The front wall of the stocker 12 conveniently includes a door to provide access into the interior of the stocker for maintenance and repair. The door includes a stocker loadport which is able to accommodate two pods 15 in the pod receiving stations 16 and 18 without opening the door. The stations include guides such that the pods 15 may be appropriately placed for access by a manipulator within the stocker.

Figure 2:
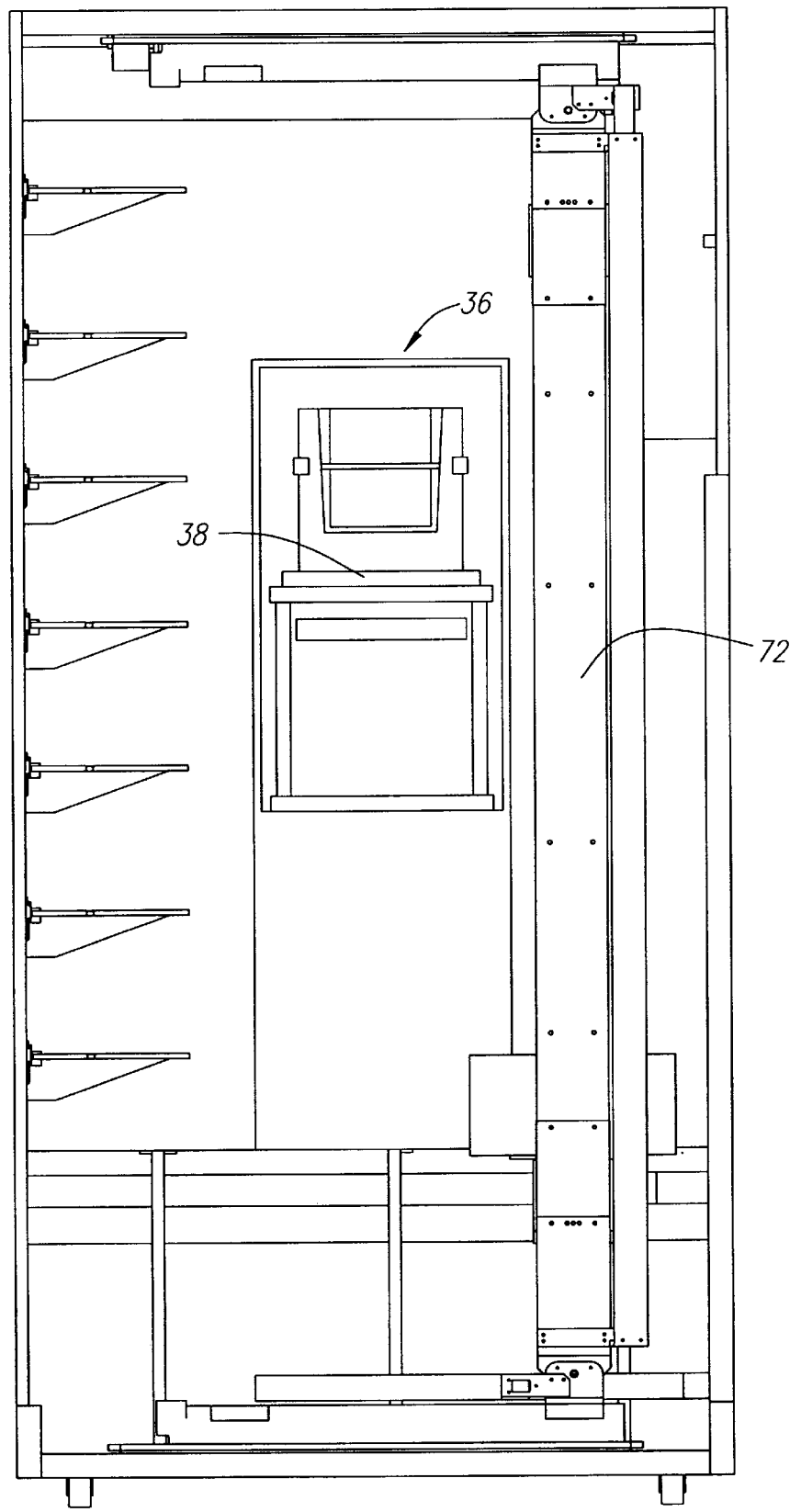
FIG. 2 is a perspective view of the interior of a stocker housing.
Figure 4:
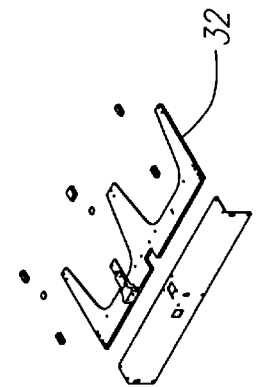
FIG. 4 is a detailed perspective view of a shelf employed in the housing of FIG. 3.
Figure 3:
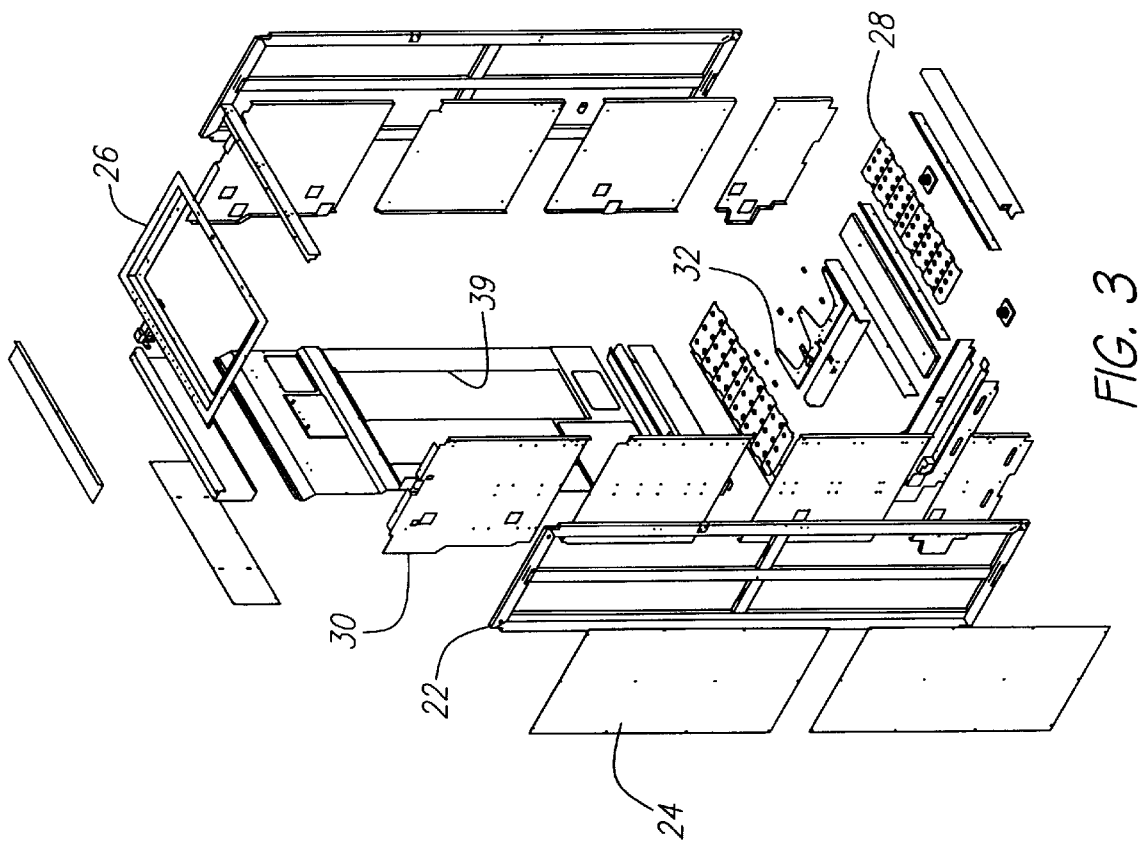
FIG. 3 is a perspective view of an exploded assembly of a stocker housing.
Figure 5:
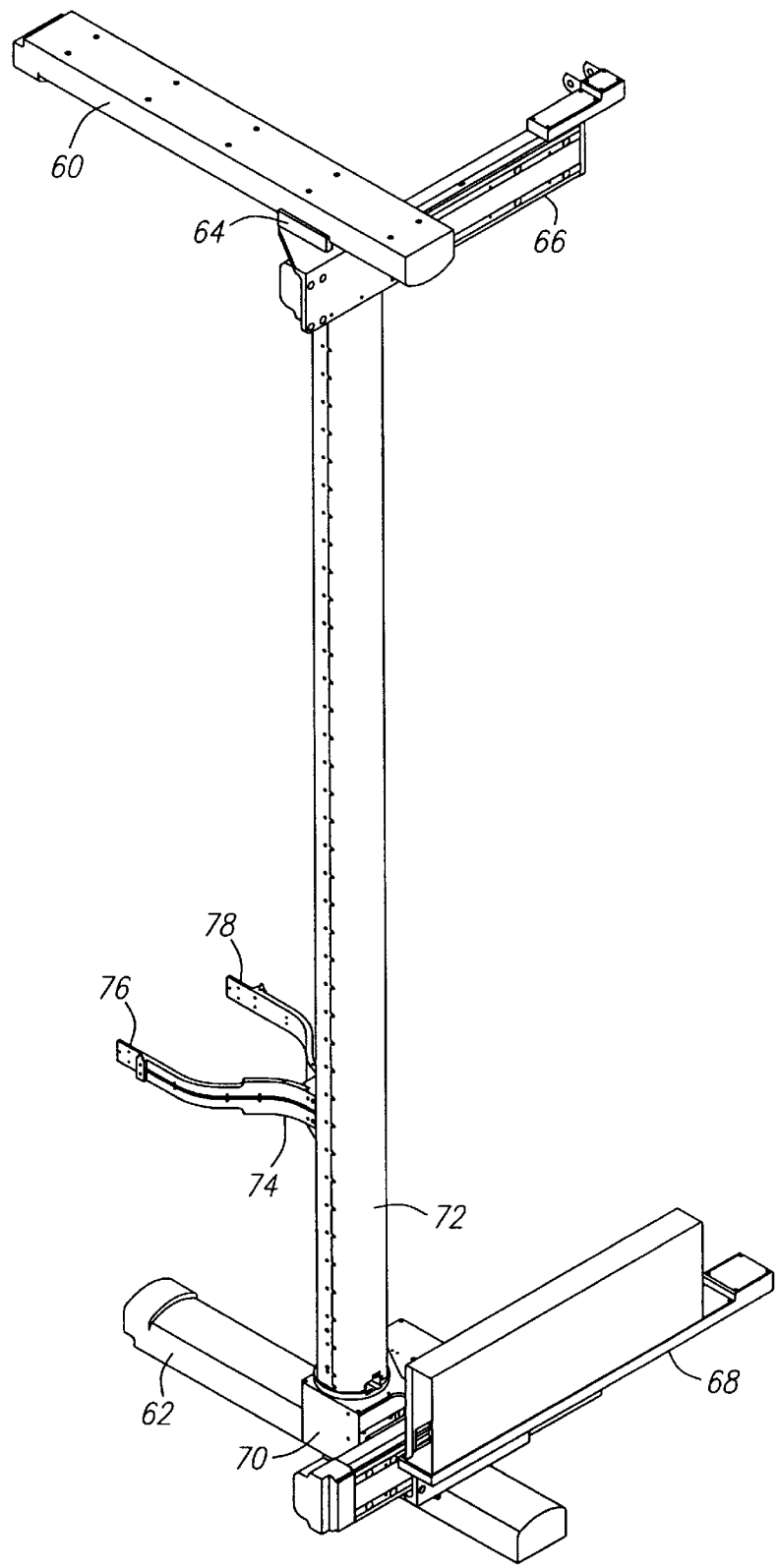
FIG. 5 is a perspective view of a manipulator for the stocker of FIG. 3.
Figure 6:
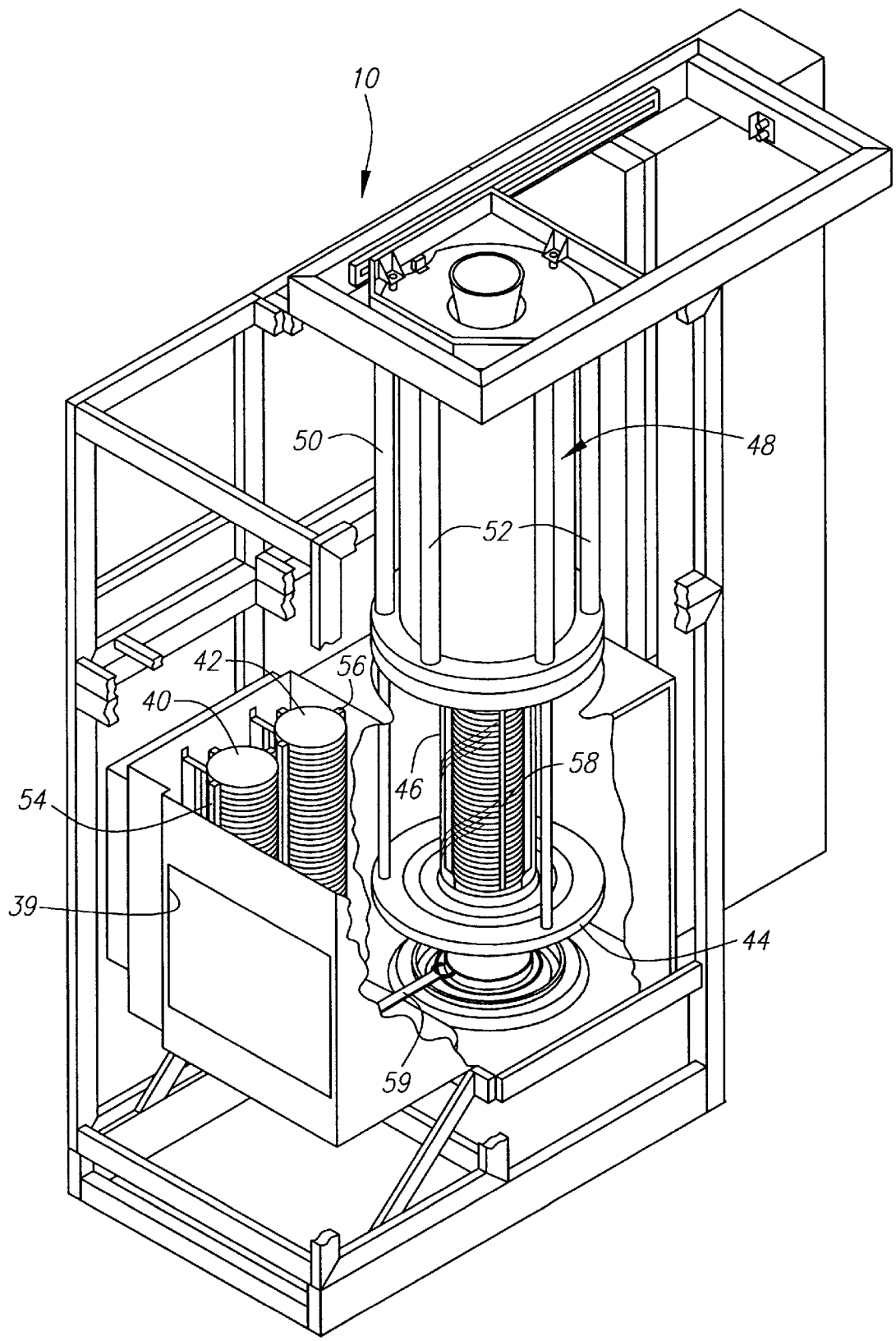
FIG. 6 is a furnace illustrated in perspective with the housing broken away for clarity.
Figure 7:
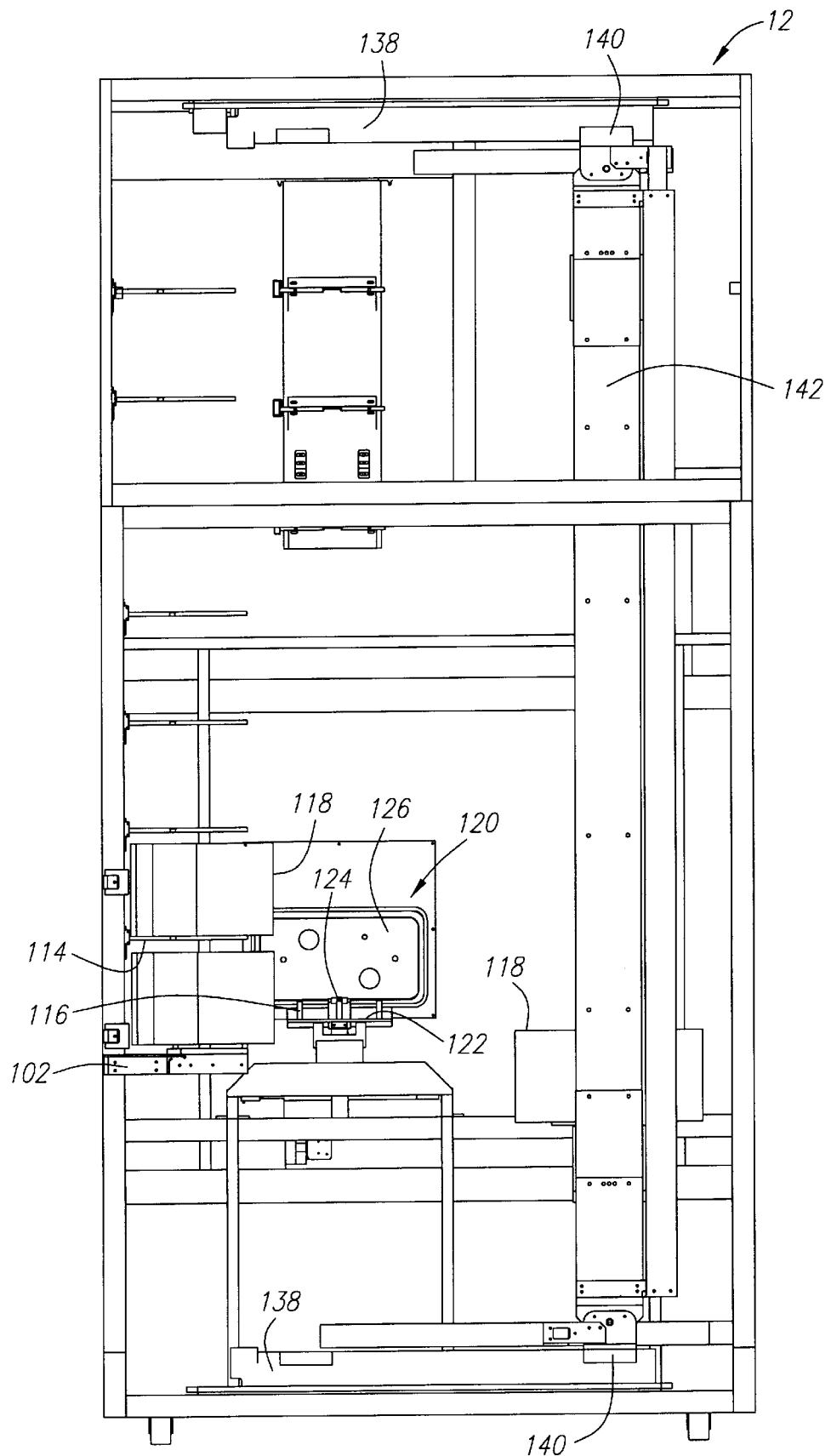
FIG. 7 is a font view of a stocker with the panels removed for clarity.
Figure 8:
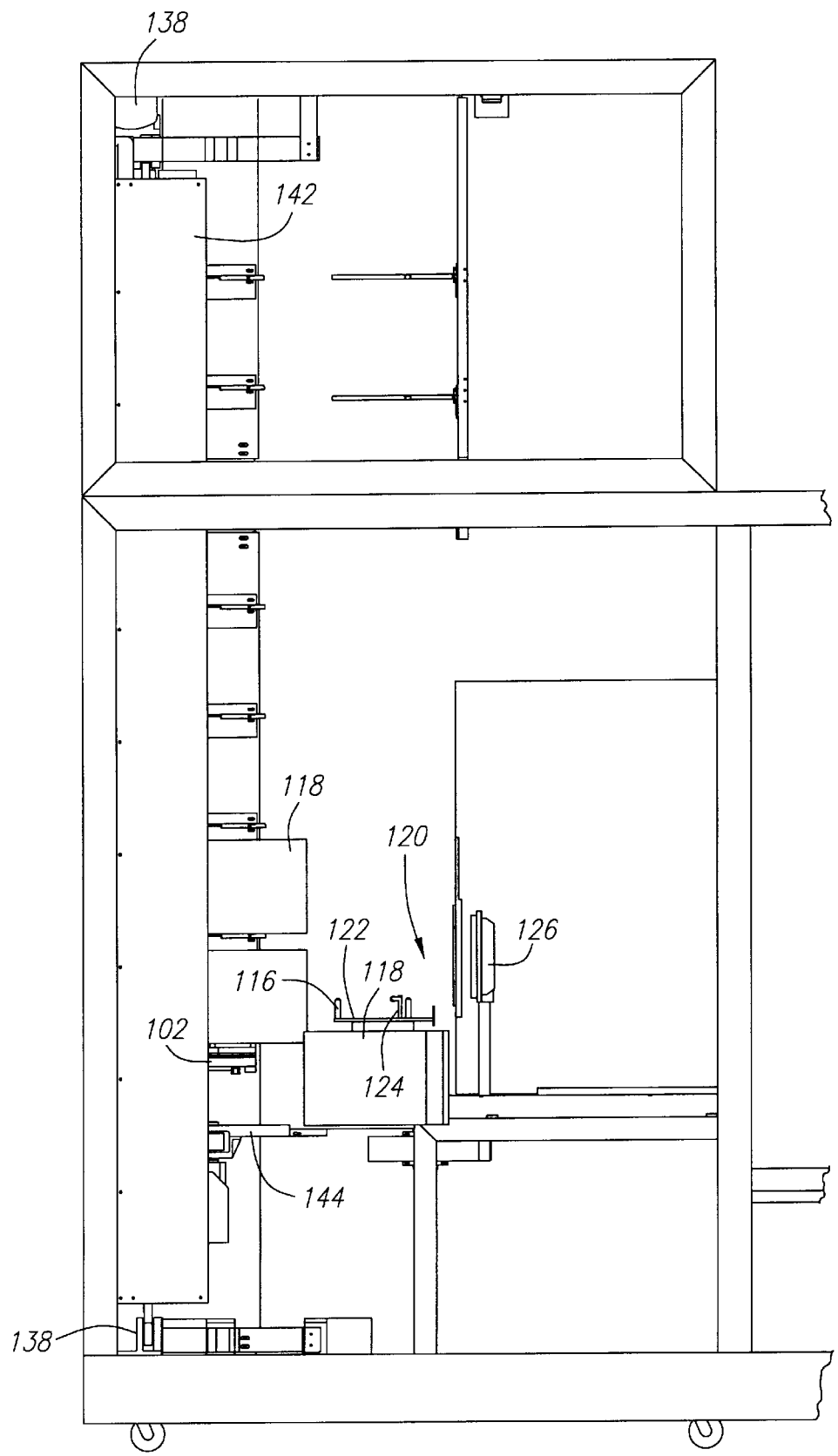
FIG. 8 is a side view of the stocker of FIG. 7.
Figure 9:
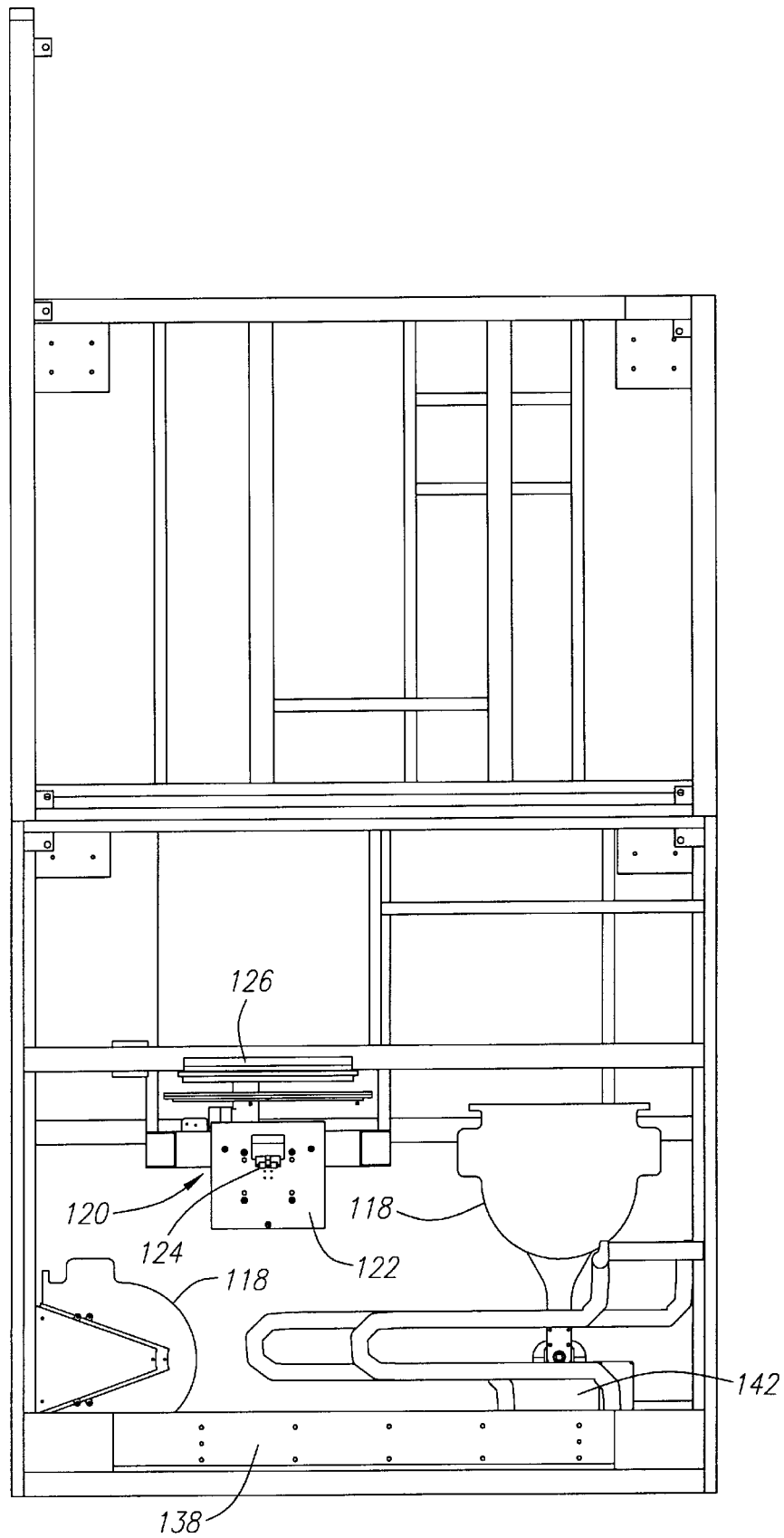
FIG. 9 is a plan view of the stocker of FIG. 7.

Referring to FIG. 2, at the interface between the stocker 12 and the furnace 10, a pod receives a furnace 15. The pods 15 are locked except when at the furnace loadport 36. In this embodiment, the furnace loadport includes a pod opener which is an indexer 38 to receive the pod 15 above the opening 39 passing through to the furnace 10. The indexer 38 unlocks the standard pod 15 and lowers the base of the pod 15 to expose the wafers contained within the pod 15 to the opening 39 into the furnace housing 10. Individual wafers are either removed from the pod 15 or placed back into the pod 15. In either event, the indexer 38 raises the base after the operation is performed to engage and lock with the cover of the pod.

The furnace 10 is behind the stocker 12 with normal access through the furnace loadport 36. A disclosure of one such furnace is fully set forth in U.S. patent application Ser. No. 08/814,723, filed Mar. 7, 1997, the disclosure of which is incorporated herein by reference. Briefly, the furnace housing 10 includes an ante area where a preload station 40 and a cooling station 42 are provided. Each station is capable of holding a full charge of wafers capable of being processed by the furnace. The furnace is of the double lift type having a base 44, a process container 46, a furnace heating element assembly 48 providing a cavity into which the process container is positioned and two lifts 50 and 52 to raise and lower the process container 46 and the furnace heating element assembly 48, respectively. Wafer supports 54, 56 and 58 are provided at the preload station, the cooling station and on the base 44, respectively. A robot, including an end effector 59, transfers discs among the pod loadport 36, the preload station 40, the wafer support 58 and the cooling station 42.

To manipulate the pods 15 within the stocker 12, a manipulator is mounted within the stocker housing. The manipulator includes two guides 60 and 62 mounted to the top and the bottom of the stocker housing 12 in parallel relationship and parallel to the plane of the stocker loadport 14. Guideways are provided with the guides 60 and 62 and receive mounts 64 which are capable of being driven along the guideways by ball screws, chain or cable drives or other similar translational mechanisms. The mounts 64 are driven together and support two guides 66 and 68. The guides 66 and 68 are perpendicular to the guides 60 and 62 and, therefore, provide guideways which are perpendicular to those of the guides 60 and 62. Mounts 70 are driven along the guideways associated with the guides 66 and 68. The mounts 70 include pivotal mountings for a vertically extending element 72. The element extends between the two assemblies of guides and mounts at the top and bottom of the stocker 12.

Because of the operation of the guides 60 and 62, the guides 66 and 68 and the pivotal mounting provided by the mounts 70, the vertically extending element 72 is capable of moving horizontally in two-dimensional space within the stocker 12. Additionally, rotation is provided to the element 72 such that a degree of freedom is provided about a vertical axis through the element 72. Finally, a track is provided along the vertically extending element 72 to receive a lifter which can be driven vertically by a ball screw mechanism.

The lifter 74 includes two tines 76 and 78 which are spaced and sized to pass closely to either side of the housing of a pod 15. Flanges extending laterally from the cover of the pod 15 about midsection receive the tines 76 and 78 of the lifter 74 such that the pod 15 can be transported. Through the operation of the various components, the lifter 74 can be moved in x and y space horizontally, vertically along a z-axis and rotationally about the z-axis. The lifter is able to extend by this mechanism to the stocker loadport 14 and each or the pod receiving stations 16 and 18 thereon, the shelves 32, and the furnace loadport 36 at the indexer 38.

In operation, pods 15 are presented on the pod receiving stations 16 and 18. The manipulator is controlled automatically to lift the pods 15 sitting on the receiving stations 16 and 18 in turn and placing them on shelves 32. A loading sequence may be performed where an operator continues to load the stations 16 and 18 until the stocker 12 is full. This can be accomplished with the stocker 12 receiving a pod at approximately one a minute. Thus, the operator can accomplish the task in approximately twenty minutes.

Once the stocker is loaded, the manipulator can employ the lifters 74 to present each of the pods 15 to the furnace loadport 36. In the embodiment described, the indexer associated with the furnace loadport 36 unlocks the base from the cover of the pod 15 positioned thereon. The indexer then lowers the base with the wafers thereon into an indexing relationship with the furnace assembly 10 so as to accommodate the end effector 59 of the furnace robot for unloading the pod into the preload station 40. Once unloaded, the indexer 38 closes the pod 15 such that the manipulator lifter 74 can replace the pod on its shelf 32. The process can be repeated until the preload station 40 is filled. Typically the preload station 40 is able to contain two pods worth of wafers.

Once the preload station 40 is loaded, the end effector 59 is able to load the wafer support 58 within the furnace. If this is not the first cycle in the operation of the furnace, the end effector 59 would first remove the processed wafers from the wafer support 58 and load them onto the wafer support 56 of the cooling station 42. After the wafers presented in the preload station 40 are placed in the furnace, the lifter 74 of the stocker 12 can present the empty pods 15 associated with the processed wafers on the indexer 36 for the end effector 59 to reload with the processed wafers. The pods 15 filled with the processed wafers would then be returned to the shelves 32 until the entire loading of pods within the stocker 12 have been processed. Alternatively, the stocker may be programmed to be semicontinuous, or upon demand, in that it is constantly placing pods 15 with processed wafers on the stations 16 and 18 and receiving new pods placed on the same stations.

Figure 10:
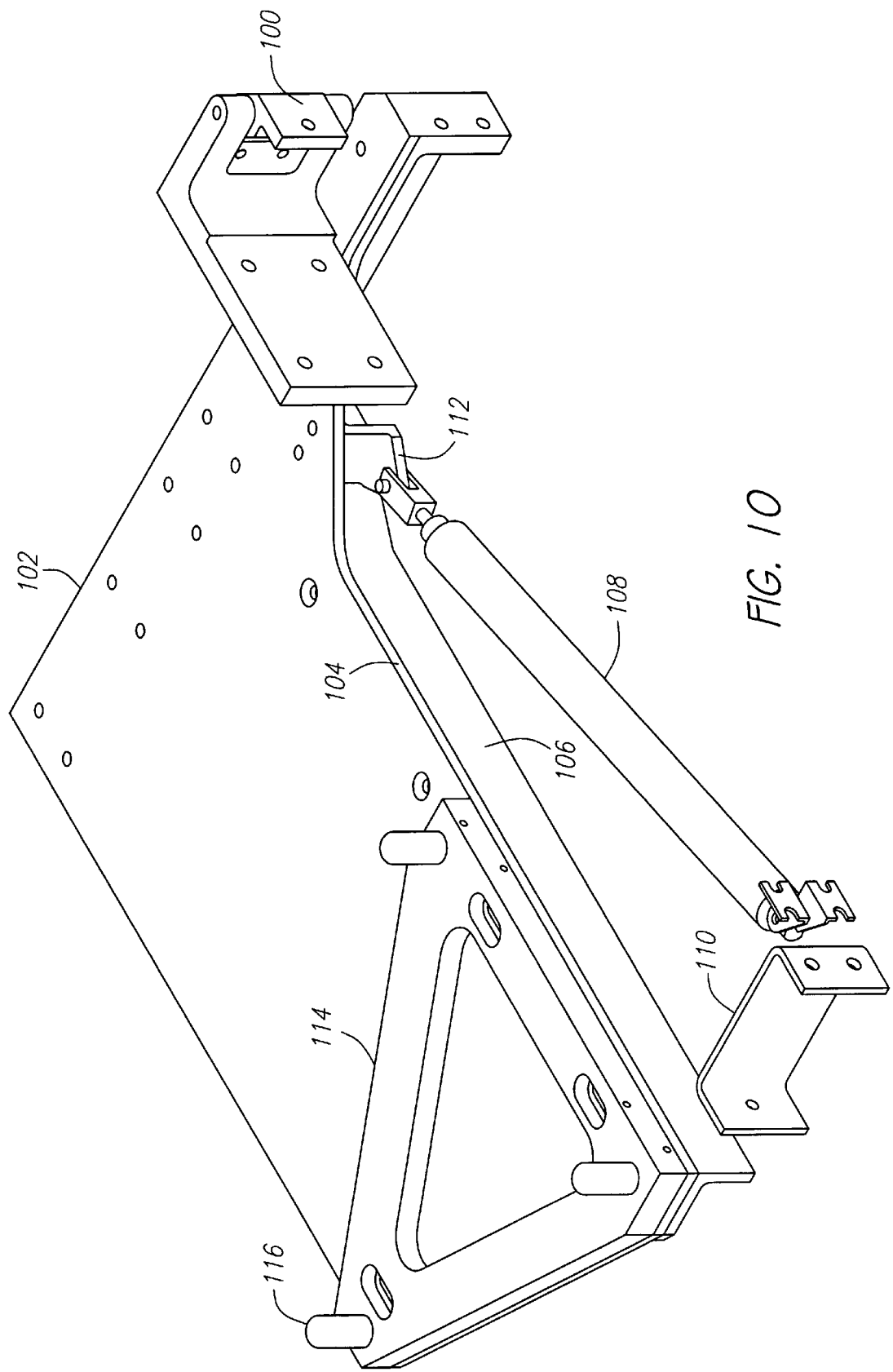
FIG. 10 is a perspective view of a support with a shelf thereon forming an element of the stocker loadport.

Looking to the embodiment of FIGS. 7 through 13, a device is contemplated for 300 mm wafers and accommodates certain conventions established for the industry on the handling thereof. The stocker 12 includes a stocker loadport which is a door 98 that is hinged to the front of the stocker housing. The door 98 is substantially a flat member that is supported by hinges 100, one of which is shown in FIG. 10.

Figure 13:
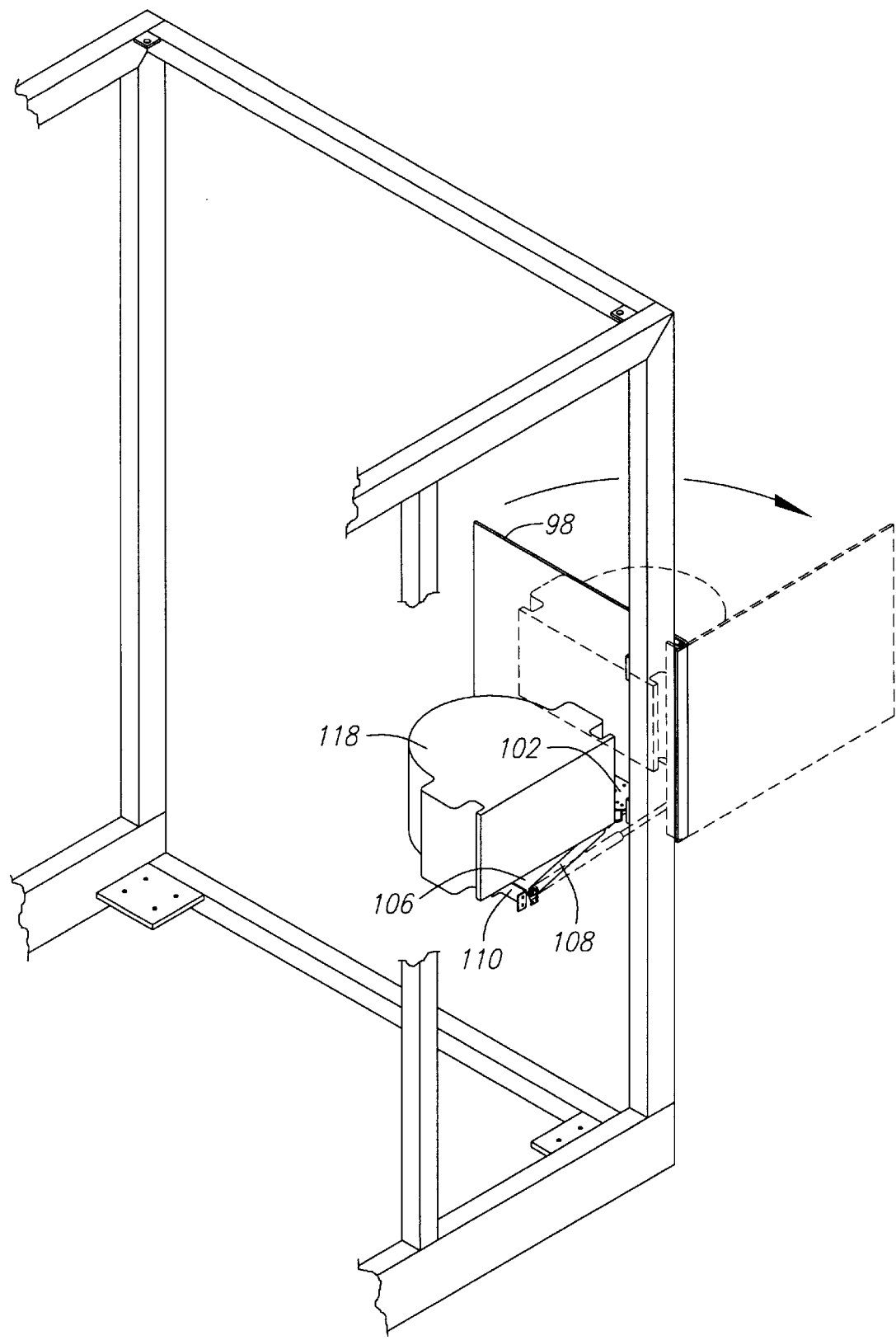
FIG. 13 is a perspective view of a stocker loadport with the open position shown in phantom.

A support 102 is affixed to the backside of the door 98 so as to be supported on the frame in a pivotal sense through the hinges 100. The support 102 is a plate 104 with a stiffening understructure 106. The door 98, the hinges and the support 102 are controlled by a pneumatic cylinder 108. The cylinder 108 is affixed by a bracket 110 to the frame of the stocker 12. A second bracket 112 is fixed to the support 102 and to the other end of the cylinder 108. With this arrangement, the cylinder 108 is able to drive the support 102 between two extreme positions, the first with the door fully closed and the support 102 arranged inwardly within the stocker housing and the second with the door opened to extend 90° from the front of the stocker and the support 102 extending from the stocker loadport as best seen in FIG. 13. A shelf 114 is positioned on the support 102. The shelf 114 includes pins 116 which cooperate with a 300 mm. pod 118.

Figure 11:
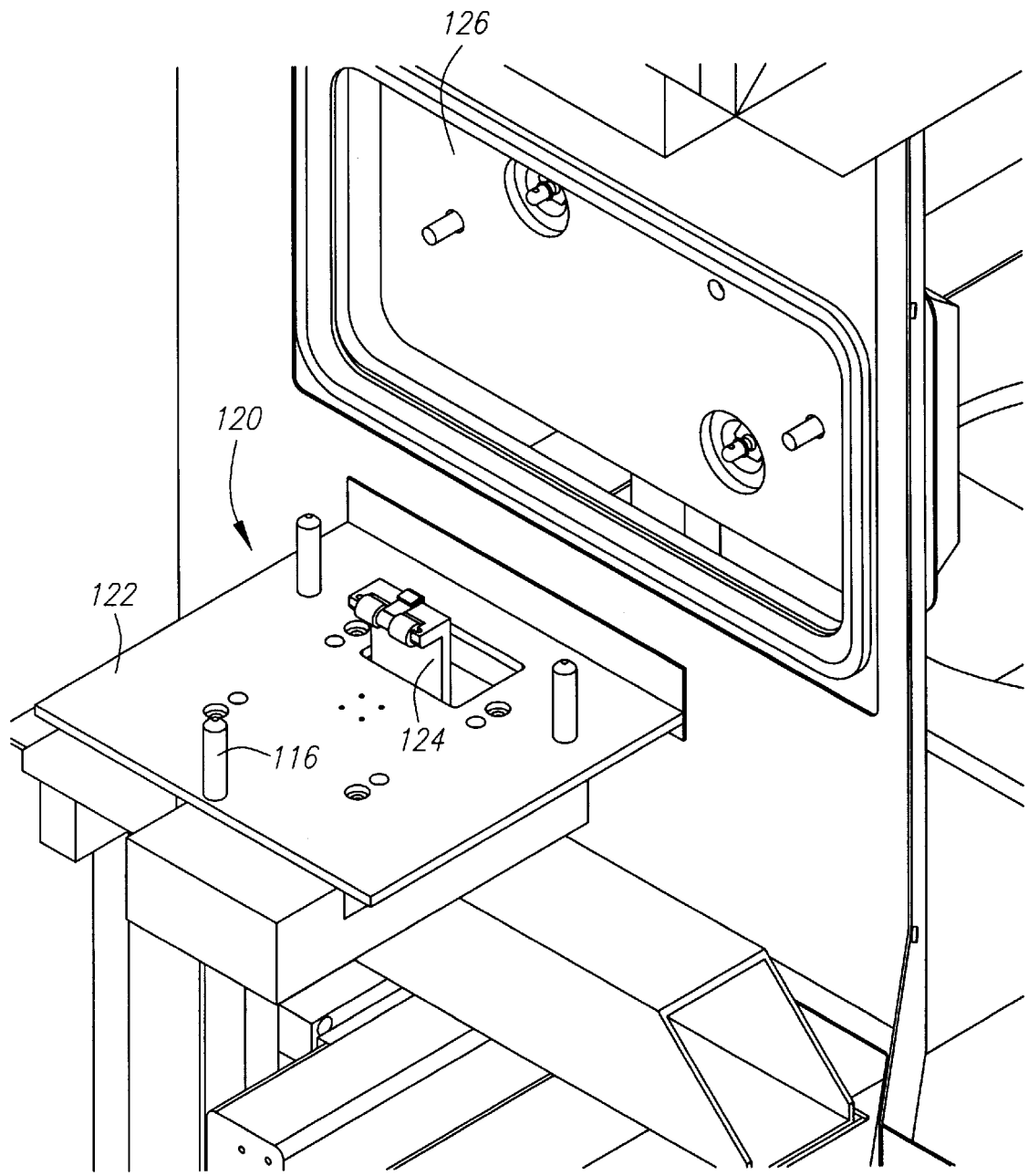
FIG. 11 is a perspective view of FOUP furnace.

A furnace loadport 120 is arranged on the far wall from the stocker loadport accommodating the support 102. The furnace loadport 120 is shown in FIG. 11 with the door thereof better illustrated in FIG. 12. The furnace loadport is a front opening unified pod (FOUP) loadport providing a pod opener and including a docking plate 122 having similarly arranged pins 116 as the shelf 114 for accommodation of a pod 118. A latch 124 is operable to engage a pod 118 when placed on the plate 122. The plate 122 is able to move toward and away from the furnace loadport 120 to bring the side of the pod 118 with a door therein up against the door 126 of the furnace loadport 120.

Figure 12:
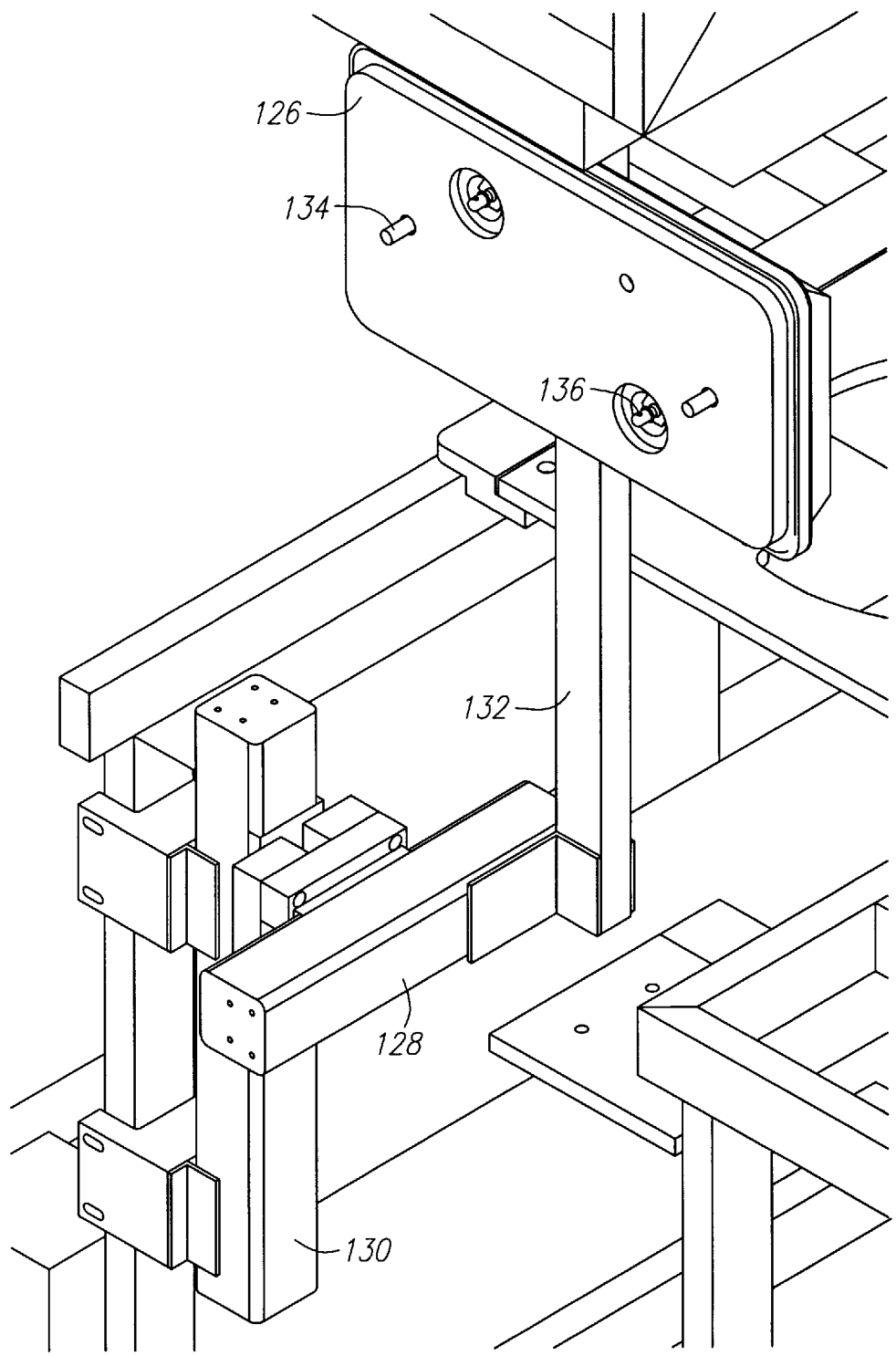
FIG. 12 is a perspective view of a furnace loadport door and accuator.

The door 126, as shown in FIG. 12, includes a first cylinder 128 and a second cylinder 130 operating at right angles to control the door 126 mounted on an arm 132. The pod opener includes rotary actuators 134 and grippers in the form of suction cups 136 on the door 126. The actuators unlock a door on the pod 118 while the suction cups 136 retain that pod door in place on the door 126. Once the pod door has been unlocked from the pod 118, the door 126 can be articulated to move away from the furnace loadport 120 and then downwardly by use of the cylinders 128 and 130. With the door 126 out of the way, a furnace end effector 59 can reach into the pod 118 and withdraw wafers for similar distribution as described with the first embodiment.

A manipulator is again positioned within the stocker 12. The manipulator is similar in construction to that which was disclosed with the first embodiment. However, the manipulator associated with this second embodiment only moves along the x-axis horizontally. Guides 138 extend parallel to the stocker loadport opening and include brackets 140 to support an assembly including a vertically extending element 142. The vertically extending element 142 is again rotatably mounted relative to the brackets 140 about the z-axis. A lifter 144 is mounted upon the vertical extending element 142 and is able to move vertically relative thereto. The manipulator assembly is able through these three degrees of freedom to reach shelves 114 in a vertical column located on one sidewall of the housing and in a vertical column immediately above the furnace loadport 120. The first position of the support 102 when it is within the housing of the stocker 12 is with the shelf 114 mounted thereon positioned in alignment within that first column of shelves 114 mounted to the side of the housing.

In operation, the lifter 144 is able to move first in the z-axis vertically and then in the x-axis horizontally to engage a pod 118. In this case, the lifter includes tines which extend to either side of a shelf 114 and extend beneath the pod 118 to then lift it from below. The manipulator can then move backwardly along the x-axis to clear the shelves 114, readjust vertically to align with the furnace loadport 120 and position the pod 118 on the docketing plate 122. As the docking plate 122 and the latch 124 can move toward and away from the furnace loadport 120, the lifter need not provide the final positioning of the pod 118. The pod 118 is then drawn to the furnace loadport 120 where the door of the pod is removed and the furnace end effector is able to unload or load the pod depending on the sequence. The same furnace operation is contemplated.

Accordingly, improved work-in-progress stockers for and in association with a furnace has been disclosed. While embodiments and applications of this invention have been shown and described, it would be apparent to those skilled in the art that many more modifications are possible without departing from the inventive concepts herein. The invention, therefore is not to be restricted except in the spirit of the appended claims.

What is claimed is:

1. A thermal processor for treating a plurality of semiconductor articles, comprising:
    a pod stocker including a pod stocker housing containing:
        a furnace loadport;
        a pod opener at the furnace loadport;
        a stocker loadport spaced apart from the furnace loadport,
        a plurality of shelves; and
        a manipulator having a lifter engageable with a pod, and movable within the housing between the furnace loadport, the stocker loadport, and the shelves,
        each shelf providing clearance for the lifter to access each pod thereon; and
    a furnace adjacent to the pod stocker, with the furnace accessible from the pod stocker via the furnace loadport.

2. The thermal processor of claim 1, with the shelves mounted on sides of the pod stocker housing between the furnace loadport and the stocker loadport.

3. The thermal processor of claim 1, the stocker loadport having a first pod receiving station and a second pod receiving station.

4. The thermal processor of claim 1, the lifter being a fork extendable to either side of each pod.

5. The thermal processor of claim 1, the lifter of the manipulator being movable horizontally in linear direction, vertically of that linear direction and pivotally about a vertical axis.

6. The thermal processor of claim 5, the lifter being a fork extendable to either side of each shelf.

7. The thermal processor of claim 5, the stocker loadport including a support pivotally mounted about a vertical axis and having a first position extending through the stocker loadport and a second position interior to the housing, one of the shelves being mounted to the support.

8. The thermal processor of claim 7, with the shelf on the support in vertical alignment with the vertical row of shelves on one side of the pod stocker housing when the support is in the second position.

9. The thermal processor of claim 1, the furnace loadport having an articulated docking plate and latch and a door, the pod opener including an actuator and grippers.

10. The thermal processor of claim 1, wherein the furnace further comprises
    a base,
    a process container positionable on the base,
    a furnace heating element assembly comprising the heating element, and being positionable on the base and having a cavity to receive the process container,
    a first lift coupled with the furnace heating element assembly,
    a second lift coupled with the process container,
    the first and second lifts being constructed and arranged to independently lift the furnace heating element assembly and the process container from the base,
    an article support within the process container with the process container positioned on the base,
    and the furnace housing about the furnace heating element assembly and the base, the pod stocker housing being adjacent the furnace housing;
    a robot with a semiconductor article end effector, the semiconductor articles at the furnace loadport and at the article support being accessible by the end effector with access to the furnace loadport from the furnace housing.

11. A thermal processor for treating a plurality of semiconductor articles contained in pods, comprising:
    a stocker including:
        a stocker housing a furnace loadport, a pod opener at the furnace loadport, a stocker loadport spaced apart from the loadport, shelves in the stocker housing and a manipulator having a lifter engageable with each pod, each shelf providing clearance for the lifter to access a pod thereon, the shelves and the pod opener being accessible by the lifter;
        the furnace loadport and the stocker loadport being opposed across the stocker housing;
        the manipulator including first guides fixed to the stocker housing near the top and bottom thereof, respectively, each first guide having a first mount drivable along the respective first guide, the manipulator also having second guides extending perpendicular to the first guides, mounted to the first mounts, respectively, and each second guide having a second mount drivable along the respective second guide, a vertically extending element pivotally mounted to the second mounts; and
        the lifter mounted to the vertically extending element and drivable vertically along the element.

12. The thermal processor of claim 11, the first guides extending parallel to the ports.

13. The thermal processor of claim 11 with the lifter movable horizontally, vertically, and pivotally about a vertical axis.

14. A thermal processor for treating a plurality of semiconductor articles presented in pods, comprising:
    a stocker including a furnace loadport, a pod opener at the furnace loadport, a stocker loadport spaced apart from the furnace loadport, shelves in the stocker and a manipulator having a lifter engageable with each pod, each shelf providing clearance for the lifter to access a pod thereon, the shelves and the pod opener being accessible by the lifter; and the lifter of the manipulator movable horizontally, vertically and pivotally about a vertical axis.

15. The thermal processor of claim 14 further comprising a support pivotally mounted to the stocker housing about a vertical axis having a first position extending through the stocker loadport and a second position interior to the stocker housing, with one of the shelves being mounted to the support.

16. A system for handling a plurality of semiconductor articles contained in pods, comprising:
 a stocker including a stocker housing having a furnace loadport, a pod opener at the furnace loadport, a stocker loadport opposite and across the stocker housing from the furnace loadport, shelves in the stocker housing, and a manipulator having a lifter engageable with each pod, each shelf providing clearance for the lifter to access a pod thereon, the shelves and the pod opener accessible by the lifter;
 the manipulator movable horizontally in two dimensional space, vertically of that two dimensional space and pivotally about a vertical axis, with the stocker loadport also accessible by the lifter; and
 the manipulator including first guides fixed to the stocker housing near the top and bottom thereof, respectively, each first guide having a first mount drivable along the respective first guide, second guides extending perpendicular to the first guides, mounted to the first mounts, respectively, and each second guide having a second mount drivable along the respective second guide, a vertically extending element pivotally mounted to the second mounts, the lifter being mounted to the vertically extending element and drivable vertically along the element.

17. A thermal processor for treating a plurality of semiconductor articles, comprising
 a stocker including a stocker housing having a furnace loadport, a pod opener at the furnace loadport, a stocker loadport, opposite from the furnace loadport across the stocker housing, shelves in the stocker housing, and a manipulator having a lifter engageable with each pod, each shelf providing clearance for the lifter to access a pod thereon;
 the lifter movable within the stocker housing to access the shelves, the pod opener, and the stocker loadport; and
 the manipulator including guides fixed to the stocker housing near the top and bottom of the stocker housing, each guide having a drivable mount, a vertically extending element mounted to the drivable mounts, and the lifter mounted to the vertically extending element and drivable vertically along the element.

18. The thermal processor of claim 17, the guides extending parallel to the ports.

19. A thermal processor comprising:
 a stocker including:
  a stocker housing having first, second, third, and fourth sidewalls, with each sidewall joined to two adjacent sidewalls;
  a furnace loadport in the third sidewall;
  a pod opener at the furnace loadport;
  a stocker loadport in one of the first, second, and fourth sidewalls;
  a manipulator within the stocker housing, the manipulator movable between the stocker loadport and the pod opener; and
 a furnace alongside the stocker, the furnace including:
  a furnace housing having furnace housing sidewalls;
  a heater element within the furnace housing; and
  an opening in one of the furnace housing sidewalls, the opening aligned with the furnace loadport sufficiently to allow wafers to be moved from the stocker into the furnace through the furnace loadport and the opening.

20. The thermal processor of claim 19 with the pod opener comprising a pod opener door sealable against the furnace loadport, the door having rotary actuators for unlocking a pod door from a pod, and suction cups for holding the pod door.

21. The thermal processor of claim 20 further comprising actuators within the furnace housing of claim 20 further comprising actuators for moving pod opener door.

* * * * *